US008546213B2

(12) United States Patent
Miyoshi et al.

(10) Patent No.: US 8,546,213 B2
(45) Date of Patent: Oct. 1, 2013

(54) METHOD OF MANUFACTURING SEMICONDUCTOR DEVICE HAVING HIGH VOLTAGE ESD PROTECTIVE DIODE

(75) Inventors: Tomoyuki Miyoshi, Akishima (JP); Shinichiro Wada, Fuchu (JP); Yohei Yanagida, Hamura (JP)

(73) Assignee: Hitachi, Ltd., Tokyo (JP)

( * ) Notice: Subject to any disclaimer, the term of this patent is extended or adjusted under 35 U.S.C. 154(b) by 308 days.

(21) Appl. No.: 12/962,631

(22) Filed: Dec. 7, 2010

(65) Prior Publication Data

US 2011/0140199 A1 Jun. 16, 2011

(30) Foreign Application Priority Data

Dec. 11, 2009 (JP) ................................. 2009-281116

(51) Int. Cl.
*H01L 21/8234* (2006.01)
(52) U.S. Cl.
USPC .................... 438/237; 438/586; 257/E21.362
(58) Field of Classification Search
CPC ............................................... H01L 29/66113
USPC .................. 438/380; 257/E21.357, E21.362
See application file for complete search history.

(56) References Cited

U.S. PATENT DOCUMENTS

| 5,969,400 | A | 10/1999 | Shinohe et al. |
| 6,384,453 | B1 | 5/2002 | Yanagigawa |
| 6,855,587 | B2 * | 2/2005 | Chi ............................... 438/186 |
| 7,056,761 | B1 * | 6/2006 | Vashchenko et al. ........... 438/91 |
| 7,282,768 | B2 * | 10/2007 | Harada .......................... 257/356 |
| 7,466,006 | B2 * | 12/2008 | Khemka et al. ............... 257/492 |
| 2008/0283908 | A1 * | 11/2008 | Pang ............................. 257/328 |
| 2010/0148214 | A1 * | 6/2010 | Terashima .................... 257/139 |

FOREIGN PATENT DOCUMENTS

| JP | 8-316480 A | 11/1996 |
| JP | 2000-114266 A | 4/2000 |

* cited by examiner

*Primary Examiner* — Stephen W Smoot
(74) *Attorney, Agent, or Firm* — Miles & Stockbridge P.C.

(57) ABSTRACT

A high voltage ESD protective diode having high avalanche withstand capability and capable of being formed by using manufacturing steps identical with those for a high voltage transistor to be protected, the device having a structure in which a gate oxide film is formed over a substrate surface at a PN junction formed of an N type low concentration semiconductor substrate constituting a cathode region and a P type low concentration diffusion region constituting an anode region, and a gate electrode which is disposed overriding the gate oxide film and a field oxide film is connected electrically by way of a gate plug with an anode electrode, whereby an electric field at the PN junction is moderated upon avalanche breakdown to obtain a high avalanche withstand capability. Further, the withstand voltage can be adjusted by changing the length of the field oxide film.

10 Claims, 11 Drawing Sheets

METHOD OF MANUFACTURING SEMICONDUCTOR DEVICE HAVING HIGH VOLTAGE ESD PROTECTIVE DIODE

CLAIM OF PRIORITY

The present application claims priority from Japanese patent application JP 2009-281116 filed on Dec. 11, 2009, the content of which is hereby incorporated by reference into this application.

FIELD OF THE INVENTION

The present invention concerns a semiconductor device formed with a high voltage diode in which a minimum anode-cathode voltage generating avalanche breakdown is higher than that of usual diodes and a manufacturing method thereof, and it particularly relates to a semiconductor device formed with a high voltage diode for ESD, protection suitable to protection of a high voltage transistor where a voltage applied between a source and a drain during an OFF state is set higher than that of usual transistors and a manufacturing method thereof.

BACKGROUND OF THE INVENTION

Heretofore, as an input/output protective element for semiconductor devices, a PN junction diode using a PN junction formed by a P type high concentration diffusion region in an anode region and an N type high concentration diffusion region in a cathode region on both sides thereof to a low concentration N type semiconductor substrate has been known (for example, refer to JP-A-Hei 8 (1996)-316480).

Further, as an input/output protective element for semiconductor devices, a semiconductor device has been known so far in which a high voltage diode as a protective element is formed over a semiconductor substrate identical with that of a high voltage NLDMOS which is a device to be protected, and a P type low concentration diffusion region of the high voltage diode is formed simultaneously with a P type low concentration diffusion region as a well of a high voltage NLDMOS and a P type high concentration diffusion region of the high voltage diode is formed simultaneously with a P type high concentration diffusion region for a well feed region of the NLDMOS, respectively (for example, refer to JP-A-2000-114266).

SUMMARY OF THE INVENTION

Figure 2:
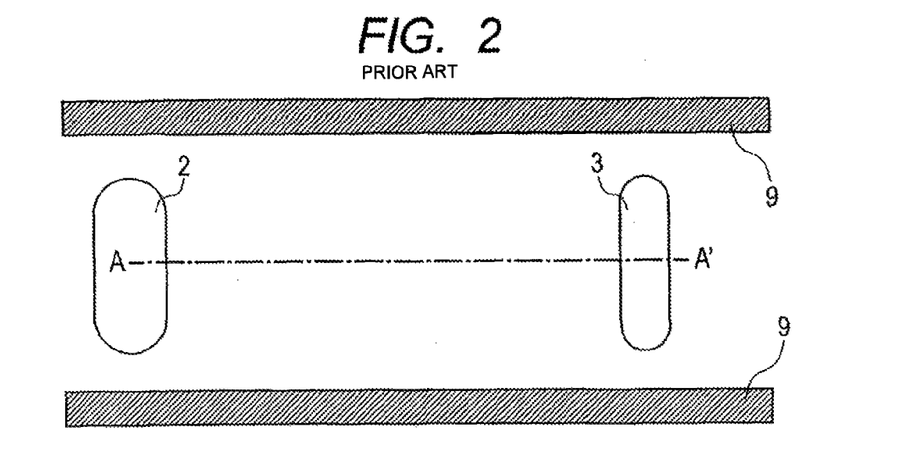
FIG. 2 is a fragmentary plan view showing an existent diode structure described in JP-A-Hei 8 (1996)-316480.
Figure 3:
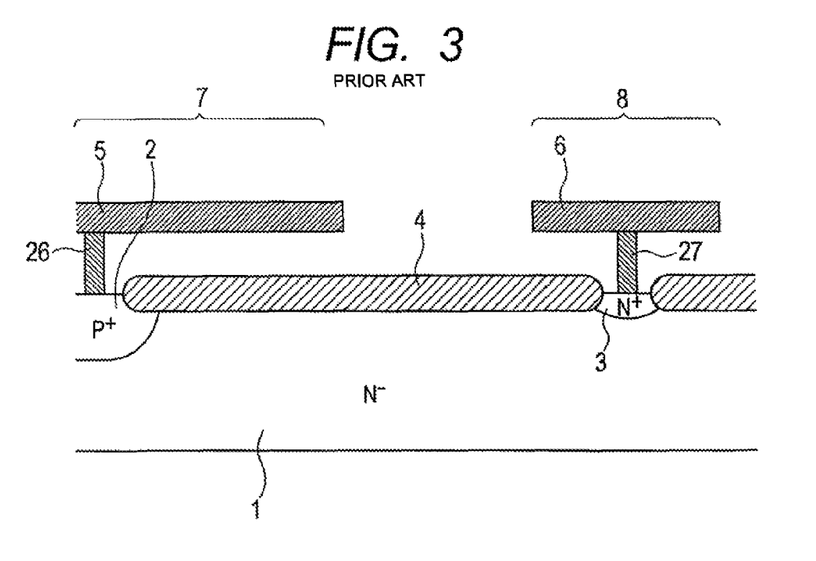
FIG. 3 is a fragmentary cross sectional view showing an existent diode structure described in JP-A-Hei 8 (1996)-316480.

In semiconductor devices, for preventing disadvantage to the semiconductor devices by electrostatic discharge (ESD) or surge voltage and current, PN junction type diodes have been mainly used as input/output protective elements for the semiconductor devices. As the PN junction diode of this type, JP-A-Hei 8 (1996)-316480 discloses, for example, a high voltage PN junction diode as shown in FIGS. 2 and 3. FIG. 2 is a plan view of the semiconductor surface of an existent PN junction diode according to the technique of JP-A-Hei 8 (1996)-316480 and FIG. 3 is an enlarged cross sectional view along line A-A' in FIG. 2. In the existent PN junction diode shown in FIGS. 2 and 3, a P type high concentration diffusion region 2 contained in an anode region 7 is disposed to a low concentration N type semiconductor substrate 1, and N type high concentration diffusion regions 3 contained in a cathode region 8 are disposed on both sides thereof to form a PN junction and constitute a PN junction diode.

When a surge voltage such as caused by ESD is applied by way of a cathode electrode 8 and a cathode plug 27 as a high voltage in the opposite direction to the N type high concentration diffusion region 3, the PN junction region is depleted to generate avalanche breakdown and an avalanche current flows from the N type high concentration diffusion region 3 in the cathode region 8 to the P type high concentration diffusion region 2 in the anode region 7. It is necessary that the voltage generating the avalanche breakdown (withstand voltage) is at a withstand voltage or lower of internal elements inside an IC for protecting the elements.

Figure 4:
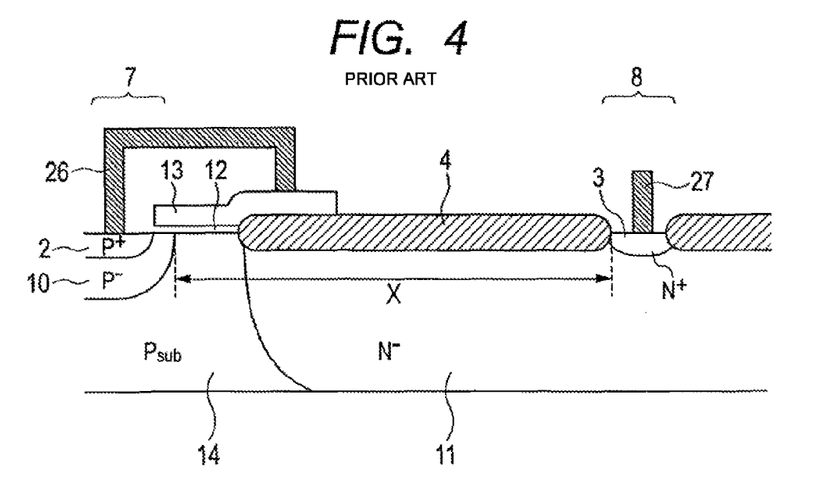
FIG. 4 is a fragmentary cross sectional view showing an existent diode structure described in JP-A-2000-114266.
Figure 5:
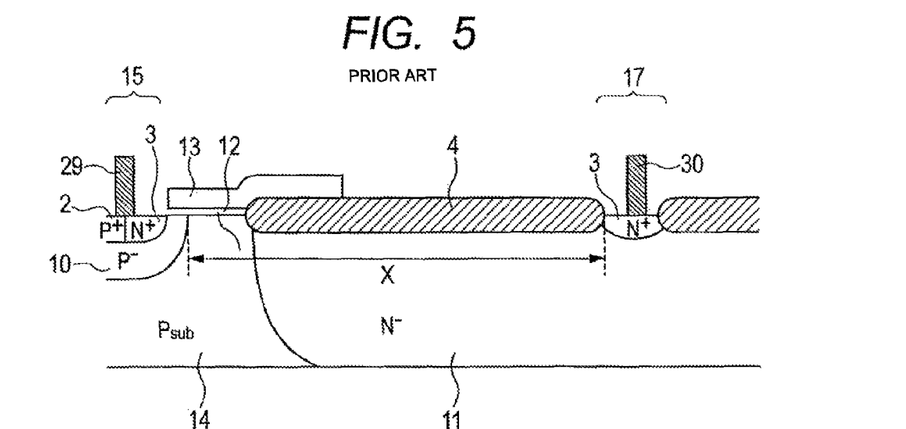
FIG. 5 is a fragmentary cross sectional view showing NLDMOS protected by the existent diode described in JP-A-2000-114266.

In view of the above, a high voltage diode having a withstand voltage lower than that of a high voltage transistor to be protected which is formed with no additional step thereby enabling to reliably protect the high voltage transistor, as well as a manufacturing method thereof are described, for example, in JP-A-2000-114266. FIGS. 4 and 5 are cross sectional structural views of a high voltage diode for ESD protection and an NLDMOS as a high voltage transistor according to the technique of JP-A-2000-114266.

The high voltage diode and the high voltage NLDMOS are formed over an identical semiconductor substrate, in which a P type low concentration diffusion region 10 of the high voltage diode is formed simultaneously with a P type low concentration diffusion region 10 as a well for the high voltage NLDMOS and a P type high concentration diffusion region 2 of the high voltage diode is formed simultaneously with a P type high concentration diffusion region 2 for a well feed region of the NLDMOS respectively. Further, an N type high concentration diffusion region 3 is formed simultaneously with an N type high concentration diffusion region 3 contained in the drain region of the NLDMOS. Further, a gate oxide film 12 and a field oxide film 4 are formed simultaneously. In the high voltage diode, a gate electrode 13 overriding both of the oxide films is connected electrically by way of a gate plug 28 to anode electrode. The withstand voltage of the high voltage diode is determined by a distance X from the P type low concentration diffusion region 10 to the N type high concentration diffusion region 3 where the depletion layer prevails. In the same manner, the withstand voltage of the high voltage NLDMOS is determined by a distance Y from the P type low concentration diffusion region 10 to the N type high concentration diffusion region 3 where the depletion layer prevails. The withstand voltage of the diode of the invention can be lowered than the withstand voltage of the high voltage NLDMOS by making the distance X of the high voltage diode smaller than the distance Y of the high voltage NLDMOS to be protected. This can discharge static charges entering upon ESD by the avalanche current of the high voltage diode thereby preventing the occurrence of disadvantages to the high voltage NLDMOS in the inside.

In an IC having an ESD protection diode mounted thereon, the ESD withstand voltage is determined by an avalanche current value of a diode (breakdown capability) of the diode that results in device breakdown of the diode for ESD protection. Generally, in order to increase the breakdown capability of the diode for ESD protection relative to an aimed ESD withstand voltage value, it is necessary to increase a region that contributes to the avalanche current and it is necessary to increase the device size. Therefore, a large protective diode is necessary which increases the cost. Accordingly, for reducing the device size, it is important to improve the breakdown capability per unit area.

On the other hand, the diode for ESD protection formed with the field oxide film as described above may involve a possibility of causing some or other disadvantages also including, for example, electrostatic breakdown by the occurrence of electric field concentration upon avalanche breakdown and this results in a problem that the breakdown capability is low.

Figure 6:
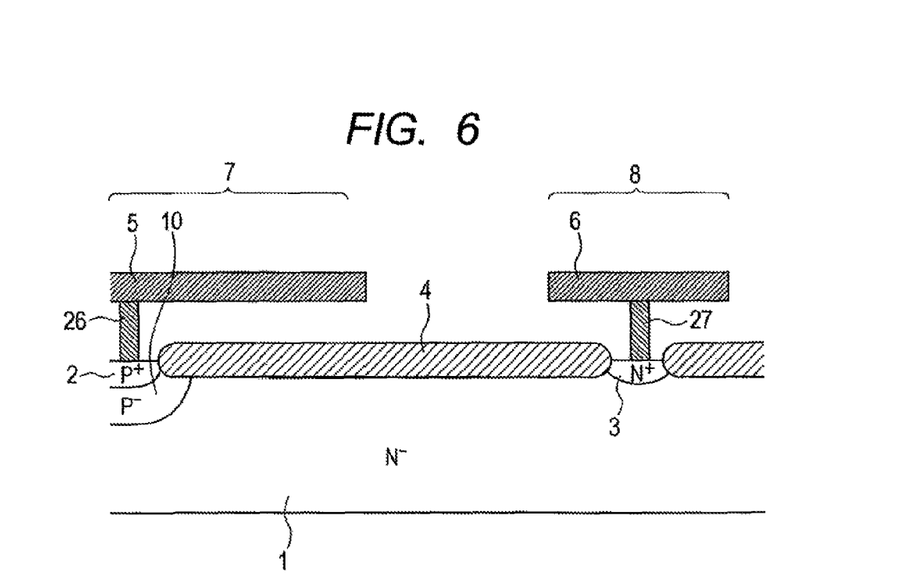
FIG. 6 is a fragmentary cross sectional view showing a diode structure to which the inventors have conducted device simulation prior to the invention.
Figure 7:
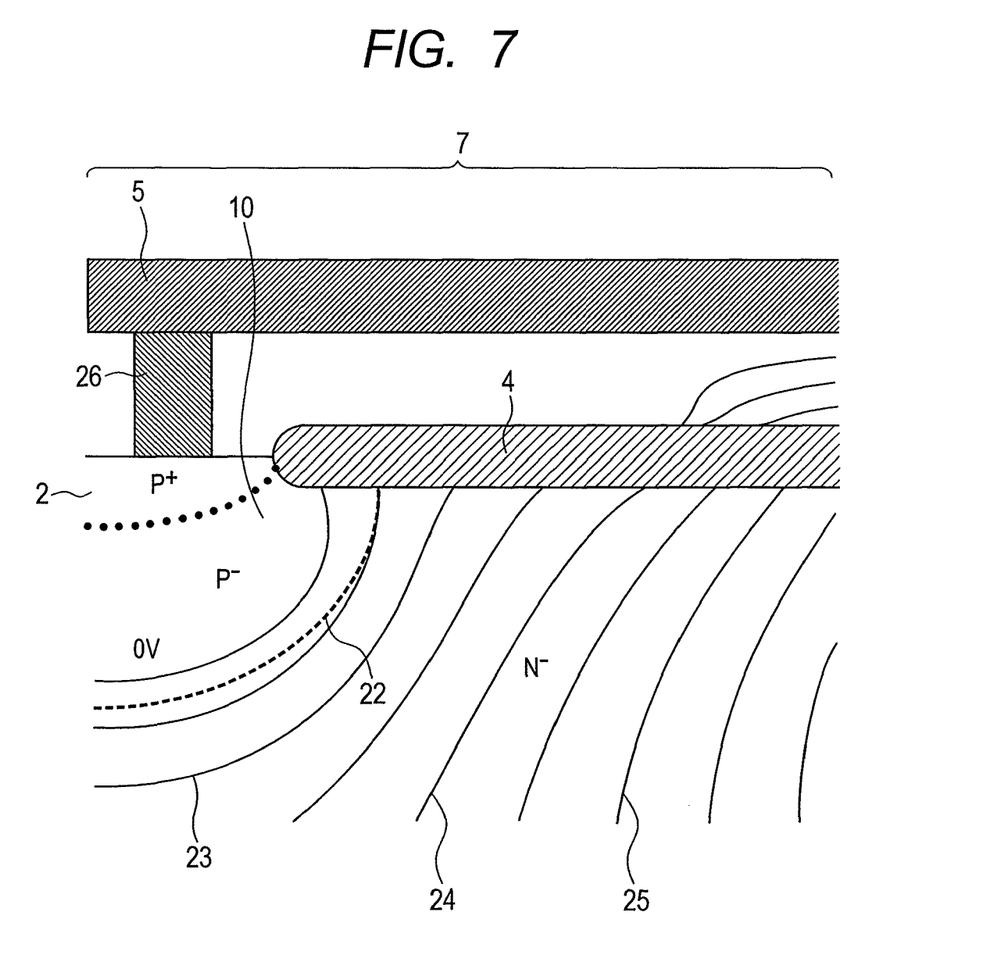
FIG. 7 is an explanatory view showing the result of conducting device simulation on the diode structure shown in FIG. 6.

The reason is to be described below. FIG. 7 is a view showing the result of calculation for the potential distribution in an OFF state by device simulation in the form of an equipotential lines (boundary line 23 between 20 V and 30 V, boundary line 24 between 40 V and 50 V, and boundary line 25 between 60 V and 70 V) in a diode structure investigated by the inventors per se prior to the present invention shown in FIG. 6, that is, a diode structure that can be prepared by identical steps with those for the high voltage LDMOS in which a channel region in a well region can be formed in a self-alignment manner with a gate electrode, and the channel length can be controlled by thermal diffusion. In the simulation, the N type semiconductor substrate 1 is formed by ion implantation of phosphorus of $7.5E11$ $cm^{-2}$ at 2.5 MeV to a boron doped P type semiconductor substrate of $3.0E411$ $cm^{-2}$ at 30 keV, a P type low concentration diffusion region 14 in the anode region 7 is formed by ion implantation of boron of $4.4E13$ $cm^{-2}$ at 30 keV, a P type high concentration diffusion region 2 in the anode region 7 is formed by ion implantation of boron of $5E15$ $cm^{-2}$ at 40 keV, and an N type high concentration diffusion region 3 in the cathode region 8 is formed by ion implantation of arsenic of $4E15$ $cm^{-2}$ at 69 keV. The distance between the N type high concentration diffusion region 3 and the P type high concentration diffusion region 2 is set to 15.5 μm. As can be seen from FIG. 7, the potential gradient is steep at the PN junction 22 just below the field oxide film to form a high electric field region. Accordingly, since the portion is liable to generate heat, the amount of static charges that can be flown till the occurrence of the disadvantage is small and the breakdown, capability is low for the structure. In the diode structures described in JP-A-Hei 8 (1996)-316480 and JP-A-2000-114266, since the PN junction is present just below the field oxide film, the problem described above is present and, accordingly, it is considered that a large device size is necessary in a case of application as a diode for ESD protection in a high voltage IC.

In view of the above, the present invention intends to provide a novel high voltage diode for ESD protection by forming a high voltage diode of moderating such electric field concentration and having a lower withstand voltage than that of a high voltage LDMOS to be protected and a higher avalanche capability with no additional steps, thereby capable of reliably protecting a high voltage LDMOS with a smaller device size, as well as a manufacturing method thereof.

Typical examples of the invention are as described below.

That is, a semiconductor device according to an aspect of the invention includes:

a semiconductor substrate of a first conduction type, a low concentration diffusion region of a second conduction type formed over the semiconductor substrate and having a conduction type which is opposite to the first conduction type, a gate oxide film formed over the surface of the low concentration diffusion region overriding a PN junction formed by contact between the first conduction type and the second conduction type, a gate electrode formed above the gate oxide film, a first high concentration diffusion region of the first conduction type having an impurity concentration higher than that of the semiconductor substrate, a second high concentration diffusion region of the second conduction type having a higher impurity concentration than that of the low concentration diffusion region, a first electrode connected electrically with the first high concentration diffusion region, and a second electrode connected electrically with the gate electrode and the second high concentration diffusion region, in which the diode is constituted with the first electrode and the second electrode being as terminals.

Further, a method of manufacturing the semiconductor device according to another aspect of the invention is a method of manufacturing a semiconductor device in which a diode having a first electrode and a second electrode different from the first electrode as terminals is formed over a semiconductor, the method including the steps of:

(a) providing a semiconductor substrate of a first conduction type, (b) forming a low concentration diffusion region of a second conduction type which is a conduction type opposite to the first conduction type over the semiconductor substrate, (c) forming a gate oxide film over the surface of the low concentration diffusion regions overriding a PN junction formed by contact between the first conduction type and the second conduction type, (d) forming a gate electrode above the gate oxide film, (e) forming a first high concentration diffusion region of the first conduction type having an impurity concentration higher than that of the semiconductor substrate, (f) forming a second high concentration diffusion region of the second conduction type having an impurity concentration higher that that of the low concentration diffusion region, (g) forming a first electrode so as to be connected electrically with the first high concentration diffusion region, and (h) forming a second electrode so as to be connected electrically with the gate electrode and the second high concentration diffusion region.

According to the invention, a high voltage diode of moderating the electric field concentration and having a withstand voltage lower than that of a high voltage LDMOS transistor to be protected and having a high avalanche capability is formed with no additional steps, thereby capable of protecting the high voltage LDMOS transistor with the protective diode of a small size.

DETAILED DESCRIPTION OF THE PREFERRED EMBODIMENTS

For attaining the objects described above, the present invention basically adopts the technical constitution as to be described hereinafter.

That is, in a first aspect of a high voltage diode of the invention, a low concentration diffusion region of a second conduction type is formed over a semiconductor substrate of a first conduction type, a gate oxide field overriding a PN junction formed by contact between both conduction types is formed over the surface thereof and a gate electrode is formed thereabove, the gate electrode is connected electrically with a second electrode formed by way of the high concentration diffusion region of a second conduction type, and a first electrode is formed by way of a high concentration diffusion region of a first conduction type.

In a second aspect of the invention, a field oxide field is formed over the surface of the semiconductor substrate of the first conduction type, and the gate electrode is formed above the gate oxide film and the field oxide film overriding both of them.

In a third aspect of the invention for a diode that protects a high voltage LDMOS in which a well region of a second conduction type and a drain region of a second conduction type are formed selectively spaced from each other over the surface layer of the semiconductor region of a first conduction type, and a source region of the first conduction type is formed over the surface layer of the well region, further, a gate electrode is disposed by way of the gate oxide film to the well region, and a source electrode in contact with the well feed region of the second conduction type and the source region on the well region is disposed, the diode has a low concentration diffusion region of the second conduction type formed simultaneously with the well region of the transistor, a high concentration diffusion region of the first conduction type formed simultaneously with the drain region of the first conduction type, a high concentration diffusion region of the second conduction type formed simultaneously with the well feed region of the second conduction type, and a gate oxide film of the diode is formed over the semiconductor substrate simultaneously with a gate oxide film of the transistor, a field oxide film of the diode is formed simultaneously with a field oxide film of the transistor, and a gate electrode of the diode is formed simultaneously with a gate electrode of the transistor.

In a fourth aspect of the invention, the length of the field oxide film is shorter than that of the field oxide film of the transistor.

In a fifth aspect of the invention, the length from the PN junction to the field oxide film is 1.7 µm or more.

In a sixth aspect of the invention, two or more regions having electrodes each paired with a drift region are present to one region having a first electrode or a second electrode are present to form a multi-channel structure.

In the seventh aspect of the invention, the device is formed over an SOI substrate.

In a first aspect of a manufacturing method of a high voltage diode according to the invention the diode has, over the semiconductor substrate, a low concentration diffusion region of a second conduction type formed simultaneously with a well region of a transistor over a semiconductor substrate, a high concentration diffusion region of a first conduction type formed simultaneously with a drain region of the first conduction type, a high concentration diffusion region of the second conduction type formed simultaneously with the well feed region of the second conduction type, and a gate oxide film, a field oxide film, and a gate electrode formed simultaneously.

In the second aspect of the invention, the high voltage diode is formed over an SOI substrate.

More specifically, the semiconductor device of the invention includes a semiconductor substrate, a low concentration diffusion region, a gate oxide film, a gate electrode, a first high concentration diffusion region, a second high concentration diffusion region, and a first electrode and a second electrode, in which a diode has a first electrode and a second electrode as terminals and in which the gate oxide film is formed over the surface of the low concentration diffusion region overriding a PN junction formed by contact between the first conduction type and the second conduction type. The semiconductor substrate is a first conduction type and the low concentration diffusion region is a second conduction type which is a conduction type opposite to the first conduction type and formed over the semiconductor substrate. The gate electrode is formed above the gate oxide film. The first high concentration diffusion region is the first conduction type and has an impurity concentration higher than that of the semiconductor substrate. The second high concentration diffusion region is a second conduction type and has an impurity concentration higher than that of the low concentration diffusion region. The first electrode is connected electrically with the first high concentration diffusion region and the second electrode is connected electrically with the gate electrode and the second high concentration diffusion region.

In the constitution described above, it is more preferred to further provide a field oxide film formed over the surface of the semiconductor substrate. In this case, the gate electrode is formed above the gate oxide film and the field oxide film overriding both of them.

In the constitution, it is preferred that the length from the PN junction to the field oxide film of the diode is 1.7 µm or more.

It is preferred to form a multi-channel structure by including two or more regions having electrodes each paired with a drift region to one of the region having the first electrode and the region having the second electrode.

It is preferred to form the semiconductor substrate with an SOI substrate in which an insulating layer is formed inside the silicon layer.

The semiconductor device of the invention constituted as described above is suitable also as a semiconductor device in which a diode protects an LDMOS transistor integrally formed simultaneously with the diode over a common semiconductor substrate and the LDMOS transfer includes a well region of a second conduction type formed over the surface layer of the semiconductor region of a first conduction type, a drain region of a first conduction type formed over the surface layer of the semiconductor region selectively spaced from the well region, a source region of the second conduction type formed over the surface layer of the well region, a gate electrode disposed to the well region by way of the gate oxide film, and a source electrode in contact with a well feed region over the well region of a second conduction type and a source region. In this case, the low concentration diffusion region is formed simultaneously with the well region of the LDMOS transistor over the semiconductor substrate, the first high concentration diffusion region is formed simultaneously with the drain region of the LDMOS transistor, the second high concentration diffusion region is formed simultaneously with the well feed region of the LDMOS transistor, and the gate oxide film, the field oxide film, and the gate electrode are formed simultaneously to each other.

In this constitution, it is preferred that the length of the field oxide film of the diode is shorter than that of the field oxide film of the LDMOS transistor.

Preferred constitution with respect to the length from the PN junction to the field oxide film of the diode, the multi-channel structure and the type of the semiconductor substrate are identical with those of the preferred constitution for the previous basic constitution.

On the other hand, the method of manufacturing the semiconductor device according to an embodiment of the invention is a method of manufacturing the semiconductor device in which a diode having a first electrode and a second electrode different from the first electrode as terminals is formed over a semiconductor substrate and which includes each of the following steps (a) to (h).

(a) providing a semiconductor substrate of a first conduction type, (b) forming a low concentration diffusion region of a second conduction type which is a conduction type opposite to the first conduction type over the semiconductor substrate, (c) forming a gate oxide film over the surface of the low concentration diffusion region overriding a PN junction formed by contact between the first conduction type and the second conduction type, (d) forming a gate electrode above the gate oxide film, (e) forming a first high concentration diffusion region of a first conduction type having an impurity concentration higher than that of the semiconductor substrate, (f) forming a second high concentration diffusion region of a second conduction type having an impurity concentration higher than that of the low concentration diffusion region, (g) forming a first electrode so as to be connected electrically with the first high concentration diffusion region, and (h) forming a second electrode so as to be connected electrically with the gate electrode and the second high concentration diffusion region.

In this constitution, it is more preferred to further include the following step (i).

(i) A step of forming a field oxide film over the surface of the semiconductor substrate.

In this case, the step (d) is a step of forming the gate electrode above the gate oxide film and the field oxide film overriding both of them.

In the constitution described above, the manufacturing method of the semiconductor device according to another embodiment of the invention is preferably a manufacturing method of a semiconductor device of integrally forming an LDMOS transistor with a diode over a common semiconductor substrate, the LDMOS transistor including a well region of a second conduction type formed over the surface layer of the semiconductor region of a first conduction type, a drain region of the first conduction type formed selectively over the surface layer of the semiconductor region spaced from the well region, a source region of a second conduction type formed over the surface layer of the well region, a gate electrode disposed to the well region by way of the gate oxide film, and a source electrode in contact with the well feed region and the source region over the well region of the second conduction type. In this case, the step (b) is a step of forming the low concentration diffusion region simultaneously with the well region of the LDMOS transistor over the semiconductor substrate, the step (e) is a step of forming the first high concentration diffusion region simultaneously with the drain region of the LDMOS transistor, the step (f) is a step of forming the second high concentration diffusion region simultaneously with the well feed region of the LDMOS transistor, the step (c) is a step of forming the gate oxide film of the diode simultaneously with a gate oxide film of the LDMOS transistor, the step (d) is a step of forming the gate electrode of the diode simultaneously with a gate electrode of the LDMOS transistor, and step (i) is a step of forming the field oxide film of the diode simultaneously with a field oxide film of the LDMOS transistor.

In the constitution, it is preferred that the length of the field oxide film of the diode is shorter than that of the field oxide film of the LDMOS transistor.

Also in the manufacturing method of the semiconductor device of the invention, a preferred constitution with respect to the length from the PN junction to the field oxide film of the diode, the multi-channel structure, and the type of the semiconductor substrate is identical with the basic constitution of the semiconductor device of the invention described above.

According to the preferred embodiments of the invention described above, the following effects can be obtained.

Figure 1:
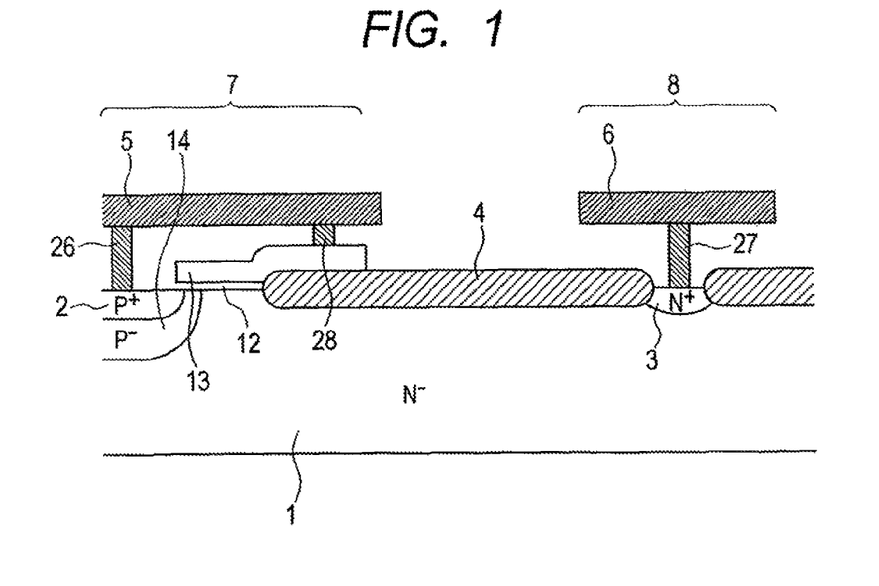
FIG. 1 is a fragmentary cross sectional view showing a basic diode structure according to a semiconductor device of the invention.
Figure 8:
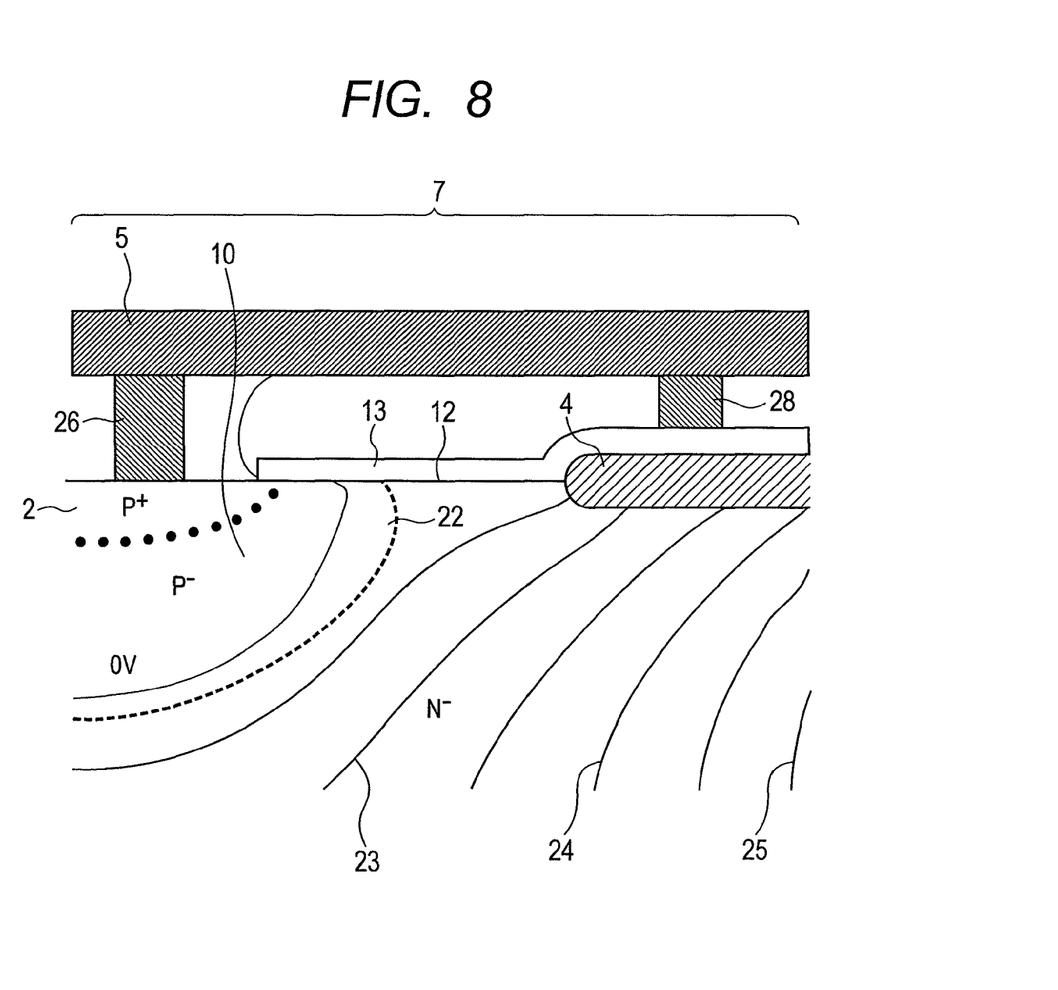
FIG. 8 is an explanatory view showing the result of conducting device simulation on the diode structure according to the semiconductor device of the invention in FIG. 1.

That is, in the diode structure as in FIG. 1 applied with the constitution described above, the potential distribution in the OFF state is calculated by device simulation, and the result of showing equi-potential lines (boundary 23 between 20 V and 30 V and boundary 24 between 40 V and 50 V) is shown in FIG. 8. In the simulation, the N type semiconductor substrate 1 is formed by ion implantation of phosphorus of 7.5E11 $cm^{-2}$ at 2.5 MeV to a P type semiconductor substrate doped with boron of 3.0E14 $cm^{-2}$ at 30 keV, the P type low concentration diffusion region 14 in the anode region 7 is formed by ion implantation of boron of 4.4E13 $cm^{-2}$ at 30 keV, the P type high concentration diffusion region 2 in the anode region 7 is formed by ion implantation of 5E15 $cm^{-2}$ at 40 keV, and the N type high concentration region 3 in the cathode region 8 is formed by ion implantation of arsenic of 4E15 $cm^{-2}$ at 69 keV. The distance between the N type high concentration diffusion region 3 and the P type high concentration diffusion region 2 was set to 15.5 µm. By forming the gate electrode by way of the gate oxide film above the PN junction 22 as shown in FIG. 8, the gate electrode acts as a field plate and the electric field is moderated in the PN junction 22. Accordingly, heat is less generated to increase the voltage leading to occurrence of disadvantage and increase the amount of static charges that can be flown. Accordingly, the avalanche withstand capability is improved.

Figure 9A:
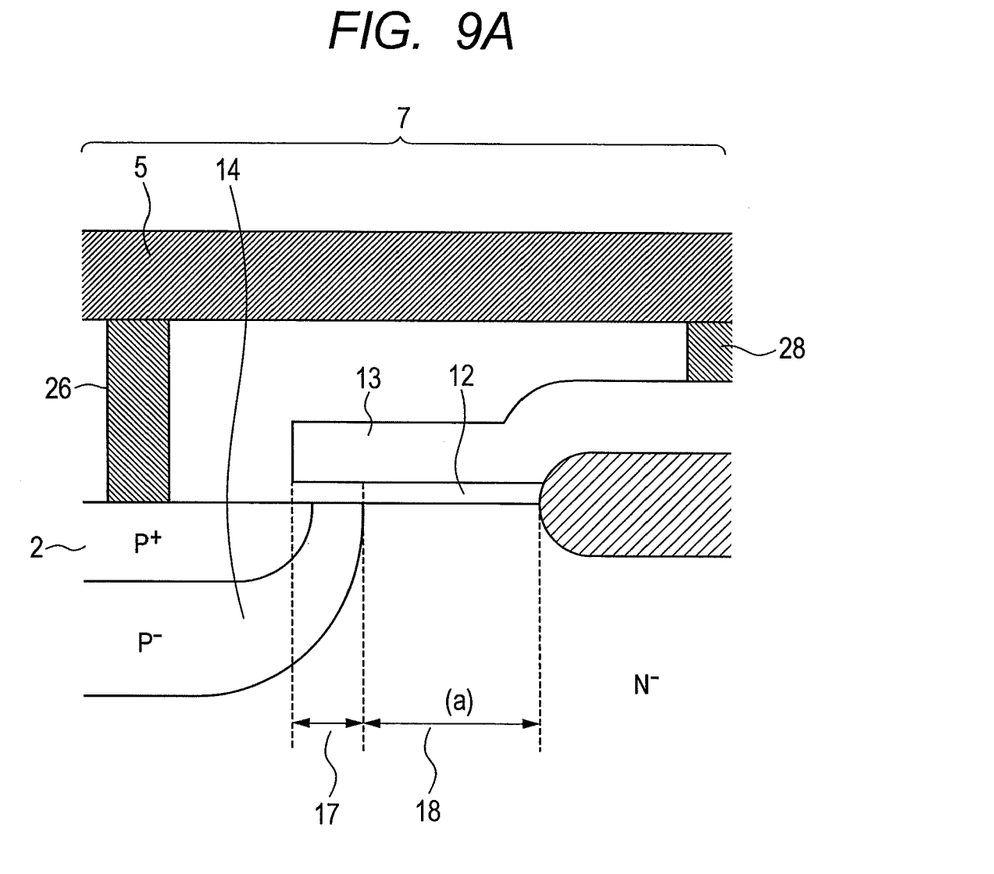
FIG. 9A is a view showing conditions in view of the device constitution which are set for confirming the effect of the invention by actually measurement.
Figure 9B:
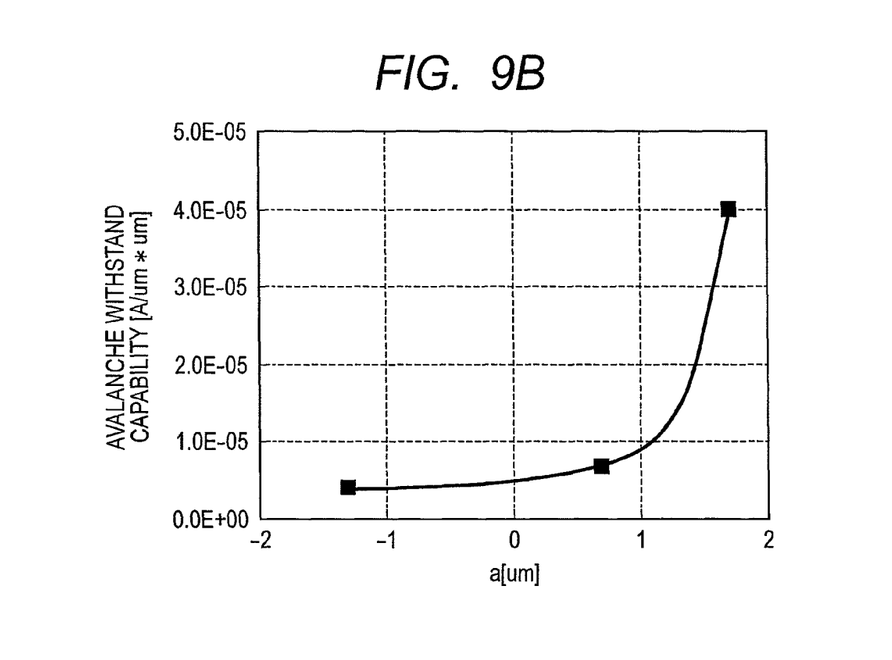
FIG. 9B is a graph showing the result of actual measurement conducted under the conditions shown in FIG. 9A for confirming the effect of the invention.

FIG. 9A is a view showing the constitutional conditions of a device which are set for confirming the effects described above by actual measurement and FIG. 9B is a graph showing the result of the measurement thereof. From the drawings, it can be seen that when the distance 18 from the end of the field oxide film to the PN junction is maintained at 1.7 μm, the breakdown withstand capability is improved by about 10 times compared with the case where the distance is 0 μm.

Further, in the diode described above, by setting the length of the field oxide film to shorter than that of the LDMOS prepared by the identical step, the withstand voltage is lowered relative to that of the LDMOS and a high voltage LDMOS can be protected upon ESD.

As described above, the diode according to the semiconductor device and the manufacturing method thereof of the invention can protect the LDMOS with a smaller device size than in the case of applying the existent structure.

Each of the embodiments of the invention is to be described specifically with reference to the drawings. In the followings, it is described that the first conduction type is the n type and the second conduction type is the p type, but same effect can be expected also for the opposite conduction types.

First Embodiment

Figure 10:
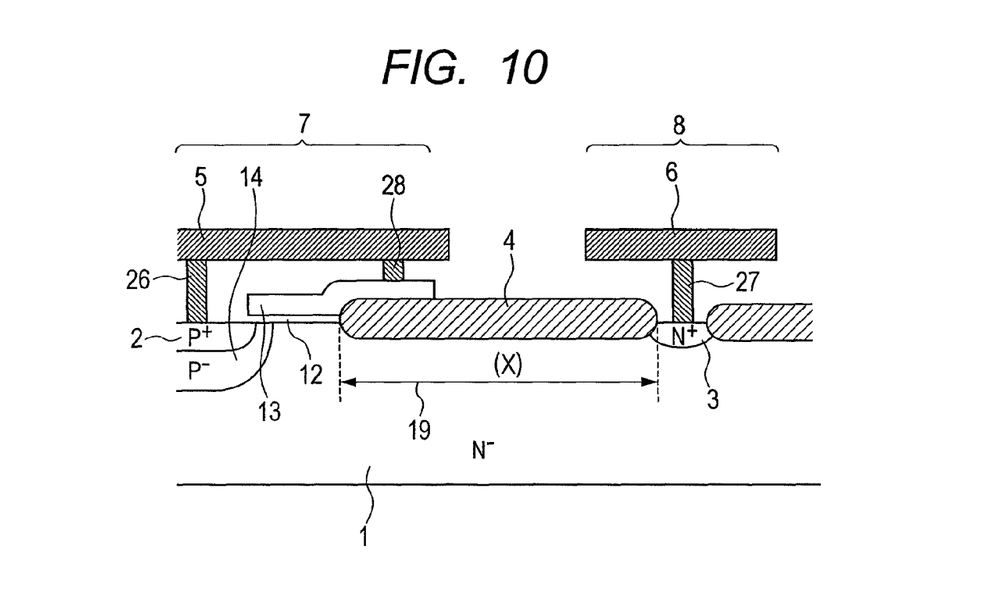
FIG. 10 is a fragmentary cross sectional view showing a diode structure according to a First embodiment which is a first embodiment of the invention.

FIG. 10 is a cross sectional view showing a structure of a specific example of a high voltage diode according to the invention. The drawing shows a high voltage diode having a P type low concentration diffusion region 14 constituting an anode region 7 formed over an N type low concentration semiconductor substrate 1 constituting a cathode region 8, a P type high concentration diffusion region 2 formed over the surface of the anode region 7, an N type high concentration diffusion region 3 formed over the surface of the cathode region, an anode electrode 5 above over the P type high concentration diffusion region 2 by way of an anode plug 26, a cathode electrode 6 formed above the N type high concentration diffusion region 3 by way of a cathode plug 27, a gate oxide film 12 disposed over the substrate surface overriding the P type low concentration diffusion region 14 and the N type low concentration semiconductor substrate 1, a gate electrode 13 disposed overriding the gate oxide film and the field oxide film, in which the gate electrode 13 is connected electrically with the anode electrode 5 by way of a gate plug 28.

Figure 11:
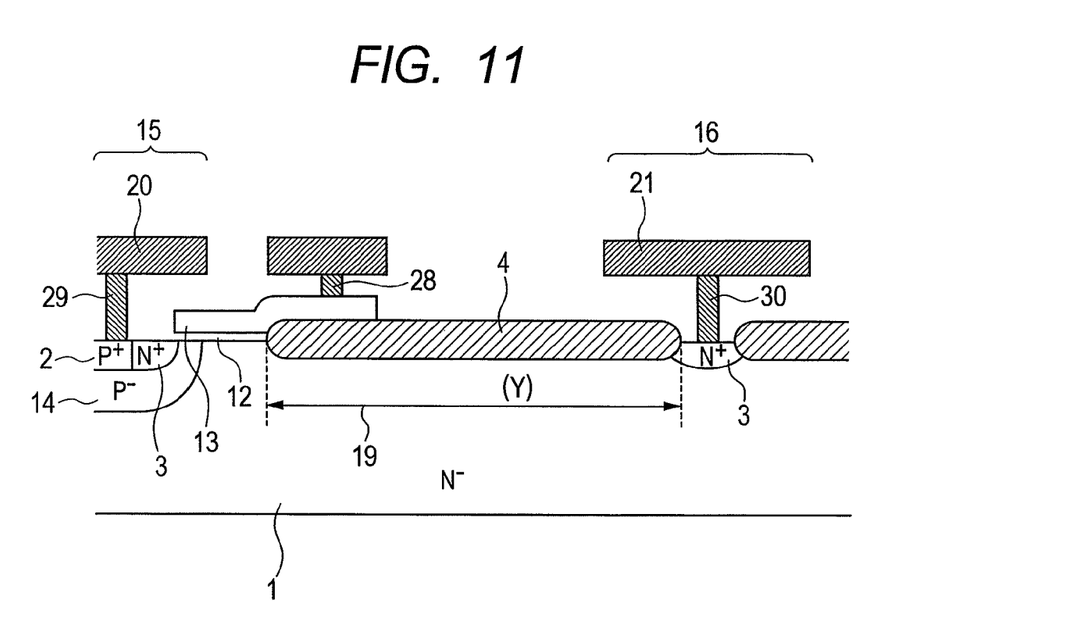
FIG. 11 is a fragmentary cross sectional view showing an NLDMOS protected by a diode according to the First embodiment which is a first embodiment of the invention.
Figure 12:
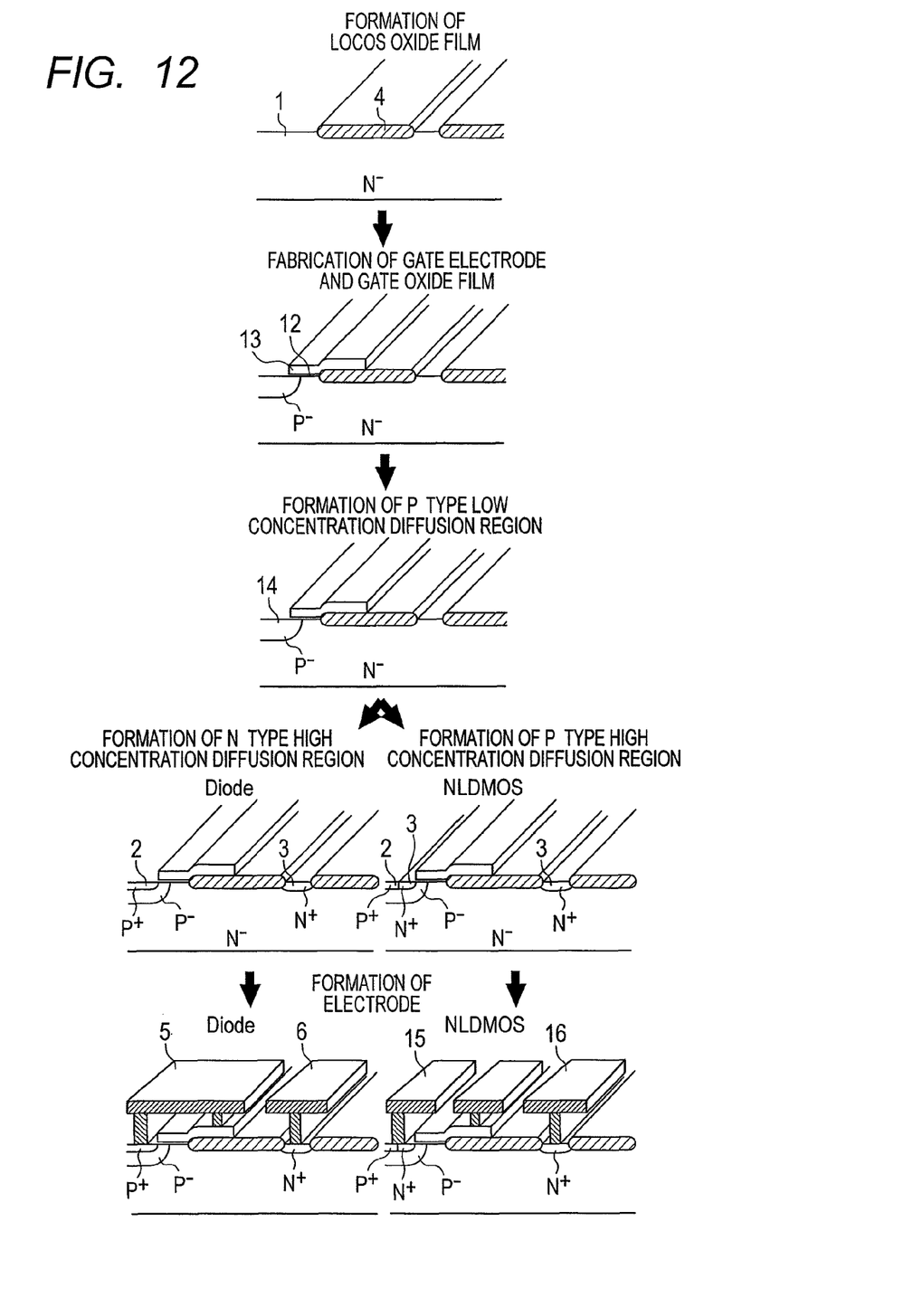
FIG. 12 is a fragmentary cross sectional view showing each of the manufacturing steps as well as a flow of the manufacturing steps for the diode according to the First embodiment which is a first embodiment of the invention.

The invention is to be described more specifically. FIG. 10 is a cross sectional view of a high voltage diode according to the invention and FIG. 11 is a cross sectional view of a high voltage NLDMOS to be protected, and the high voltage diode and the high voltage transistor are formed simultaneously over an identical substrate. FIG. 12 shows the steps of forming the diode and the NLDMOS. In the diode of the invention, for forming anode and cathode regions over an N type low concentration semiconductor substrate 1, a field oxide film 4 is patterned and then a gate oxide film 12 and a gate electrode 13 are formed. Then, a P type low concentration diffusion region 14 is formed by ion implantation in self-alignment manner to the thus formed gate electrode 13. Then, high concentration regions 2 and 3 are formed over the surface of a region of the P type low concentration diffusion region 14 of the N type semiconductor substrate 1, and an interconnection is fabricated so as to electrically connect the gate electrode and the anode electrode. On the other hand, in a high voltage NLDMOS to be protected, for forming source and the drain regions to the N type low concentration semiconductor substrate 1, a field oxide film is patterned and then an oxide film 12 and a gate electrode 13 are formed. Then, a P type low concentration diffusion region 14 as a well region is formed by ion implantation in a self-alignment manner to the thus formed gate electrode 13. Then, a source region, a well feed region, and a drain region are formed by ion implantation to the N type high concentration region 3, the P type high concentration diffusion region 2, and the N type high concentration diffusion region 3, and interconnections are fabricated.

In the high voltage diode formed as described above, when a voltage is applied to the N type high concentration diffusion region 3 as a cathode, avalanche breakdown occurs at the withstand voltage to increase the current. While the potential distribution inside the substrate shows a steep gradient in the vicinity below the field oxide film on the side of the anode region, the potential gradient in the vicinity of the substrate surface is moderated by the field plate effect of the formed gate electrode 13. Accordingly, since a great amount of static charges can be flown till the occurrence of the thermal disadvantage occurs after the starting of the avalanche breakdown, size reduction of the diode necessary for obtaining a predetermined ESD withstand voltage can be expected. Further, the withstand voltage of the diode and that of the NLDMOS prepared in the steps described above depend on the length of the field oxide film. When the length X of the field oxide film of the diode is set shorter than the length Y of the field oxide film of the NLDMOS the withstand voltage of the diode of the invention can be made lower than the withstand voltage of the NLDMOS. Accordingly, when ESD charges are introduced into an IC, avalanche occurs in the diode of lower withstand voltage and the diode acts as a discharging device to play a role of protecting the NLDMOS.

Second Embodiment

Figure 13:
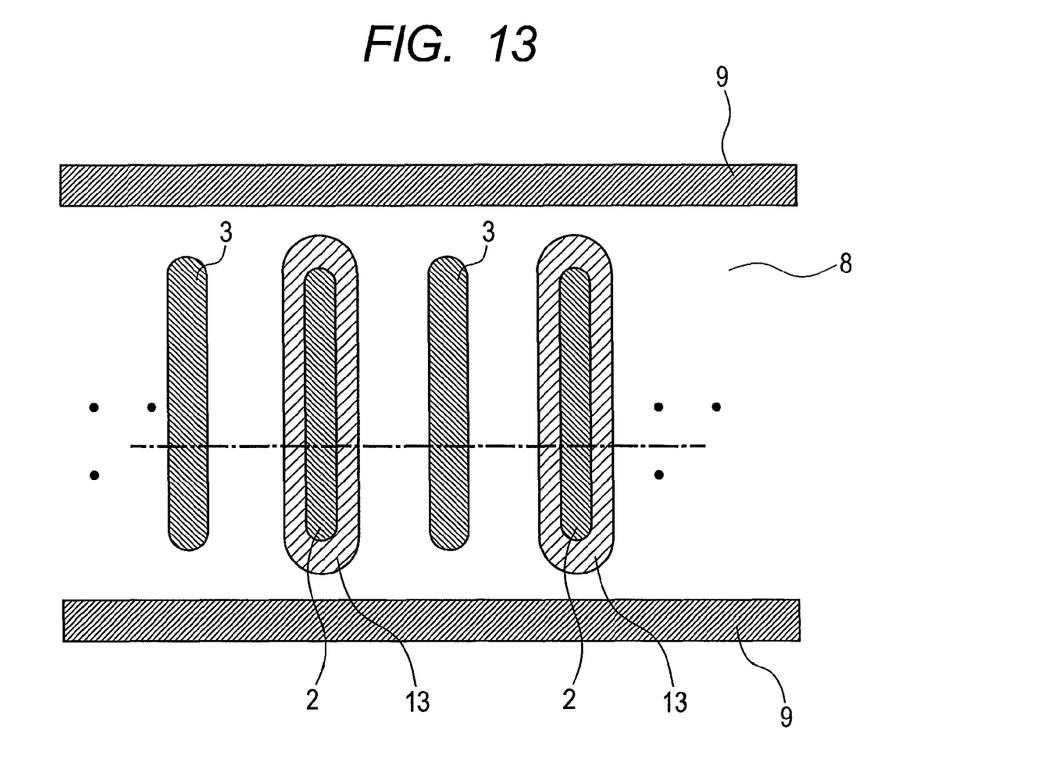
FIG. 13 is a fragmentary plan view showing a diode structure according to a second embodiment which is a second embodiment of the invention.
Figure 15:
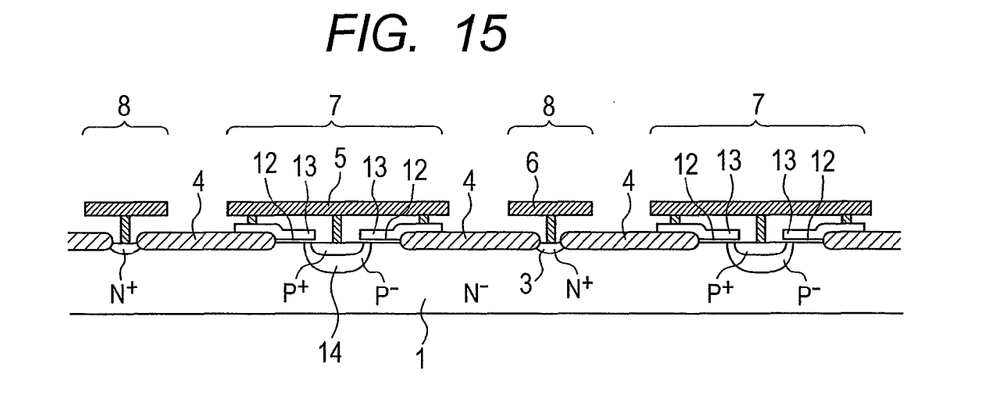
FIG. 15 is a common fragmentary cross sectional view corresponding to both of the diode structure of the second embodiment in FIG. 13 and the diode structure of the third embodiment in FIG. 14.

FIGS. 13 and 15 show another example of a high voltage diode applied with the invention. FIG. 13 is a fragmentary plan view in the vicinity of a semiconductor surface and FIG. 15 shows a fragmentary cross sectional view thereof. Two cathode regions (or anode regions) are disposed each for one anode region (or cathode region) on both sides thereof to form a multi-channel structure. Further, all anode regions and cathode regions are connected electrically by interconnection of electrodes.

When a high voltage is applied to the cathode electrode, avalanche breakdown occurs at a withstand voltage to increase the current. When the length of all field oxide films of the diode in the multi-channel structure is made equal, the withstand voltage at which avalanche breakdown occurs is made equal for the entire channels. While the slope becomes steep in the vicinity of the end of the field oxide film of the anode, the potential gradient is moderated in the vicinity of the substrate surface due to the field plate effect of the formed FG electrode. Accordingly, a great amount of static charges can be flown till the occurrence of thermal disadvantage after starting of the avalanche breakdown. In a multi-channel structure where the length of the field oxide film is equal for the entire channels, static charges that can be flown are several times as large as the number of channels. In a case of applying this multi-channel structure, since the size can be decreased by so much as the anode region (or cathode region) adjacent with a device isolation region compared with a case of arranging 1-channel structure devices by a required number to the aimed ESD withstand voltage, this can provide a size reduction effect of the device.

Third Embodiment

Figure 14:
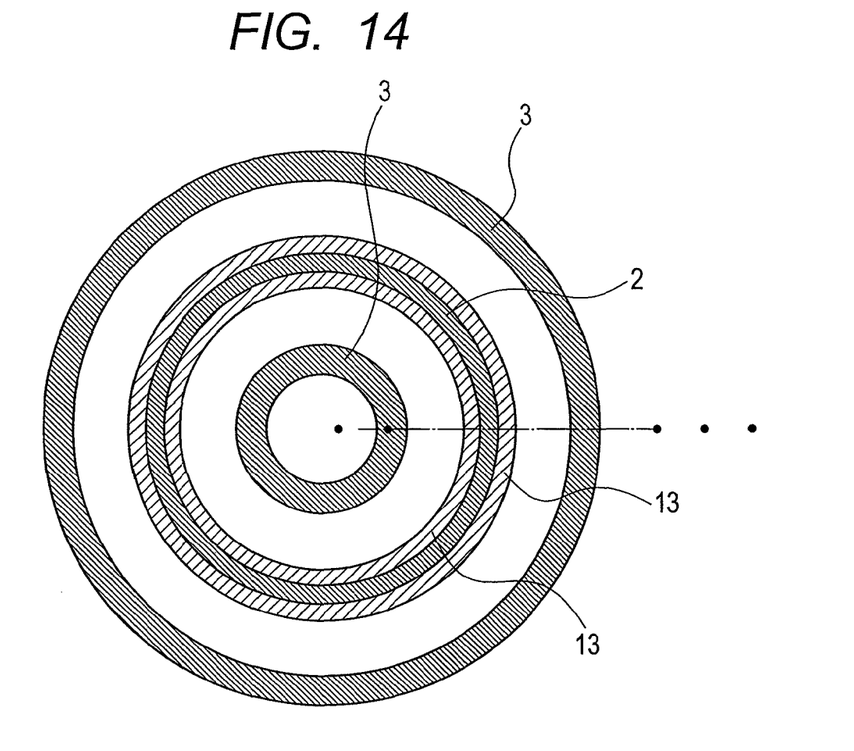
FIG. 14 is a fragmentary plan view showing a diode structure according to a third embodiment which is a third embodiment of the invention.

FIGS. 14 and 15 show a further example of a high voltage diode applied with the invention. FIG. 14 is a fragmentary plan view in the vicinity of a semiconductor surface and FIG. 15 shows a fragmentary cross sectional view. The structure is identical with that of the second embodiment described above in that two cathode regions (or anode regions) are disposed on both sides of are 1 anode region (or cathode region) to form a multi-channel structure and in that electrodes are connected electrically by interconnection for all anode regions and cathode regions. The structure is different from that of the second embodiment in that each of the regions for the anode and the cathode is arranged on a concentric circle with a certain point as a center, and each of the regions is formed in a ring shape so as to provide a structure not having ends.

Also in the structure of this example, when a high voltage is applied to the cathode electrode, avalanche breakdown occurs at the withstand voltage to increase the current in the same manner as in the structure of the second embodiment. When the length of all field oxide films of the diode having a multi-channel structure is set equal, the withstand voltage at which avalanche breakdown occurs is equal for all channels. While the potential distribution inside the substrate shows a steep gradient in the vicinity at the end of the field oxide film of the anode, the potential gradient is moderated in the vicinity of the substrate surface since the field plate effect of the formed FG electrode exerts. Accordingly, a great amount of static charges can be flown till the occurrence of thermal disadvantage after starting the avalanche breakdown. In the multi-channel structure where the length of the field oxide films is made equal for entire channels, the static charges that can be flown is increased by the number of the channels. When the multi-channel structure is applied, since the size can be decreased by so much as the anode regions (or cathode region) adjacent with the device isolation region compared with the case of arranging the devices of one-channel structure by a required number to the aimed ESD withstand voltage, size reduction effect of the device can be provided.

What is claimed is:

1. A method of manufacturing a semiconductor device configured by forming a diode having a first electrode and a second electrode different from the first electrode as terminals over a semiconductor substrate, the method comprising:
   (a) providing the semiconductor substrate of a first conduction type;
   (b) forming a low concentration diffusion region of a second conduction type which is a conduction type opposite to the first conduction type over the semiconductor substrate;
   (c) forming a gate oxide film over a surface of the low concentration diffusion region overriding a PN junction formed by contact between the first conduction type and the second conduction type;
   (d) forming a gate electrode above the gate oxide film;
   (e) forming a first high concentration diffusion region of the first conduction type having an impurity concentration higher than that of the semiconductor substrate;
   (f) forming a second high concentration diffusion region of the second conduction type having an impurity concentration higher than that of the low concentration diffusion region;
   (g) forming a first electrode so as to be connected electrically with the first high concentration diffusion region; and
   (h) forming a second electrode so as to be connected electrically with the gate electrode and the second high concentration diffusion region.

2. The method of manufacturing a semiconductor device according to claim 1, further comprising:
   (i) forming a field oxide film over the surface of the semiconductor substrate,
   wherein the step (d) is a step of forming the gate electrode above the gate oxide film and the field oxide film overriding both of the films.

3. The method of manufacturing a semiconductor device according to claim 2,
   wherein the length from the PN junction to the field oxide film of the diode is 1.7 μm or more.

4. The method of manufacturing a semiconductor device according to claim 2,
   wherein a multi-channel structure is formed by including two or more regions having electrodes each paired with a drift region to one of a region having the first electrode and a region having the second electrode.

5. The method of manufacturing a semiconductor device according to claim 2,
   wherein the semiconductor substrate is an SOI substrate in which an insulation layer is formed inside a silicon layer.

6. The method of manufacturing a semiconductor device according to claim 2, configured by integrally forming a LDMOS transistor together with the diode over a common semiconductor substrate, the LDMOS transistor including:
   a well region of the second conduction type formed over a surface layer of a semiconductor region of the first conduction type;
   a drain region of the first conduction type formed over a surface layer of a semiconductor region selectively spaced from the well region;
   a source region of the second conduction type formed to the surface layer of the well region;
   a gate electrode disposed by way of a gate oxide film to the well region;
   a source electrode in contact with a well feed region over the well region and the source region of the second conduction type is further formed integrally with the diode over a common semiconductor substrate, and
   a field oxide film formed over the semiconductor substrate,
   wherein the step (b) is a step of forming the low concentration diffusion region simultaneously with the well region of the LDMOS transistor over the semiconductor substrate,
   wherein the step (e) is a step of forming the first high concentration diffusion region simultaneously with the drain region of the LDMOS transistor,
   wherein the step (f) is a step of forming the second high concentration diffusion region simultaneously with the well feed region of the LDMOS transistor,
   wherein the step (c) is a step of forming the gate oxide film of the diode simultaneously with the gate oxide film of the LDMOS transistor,
   wherein the step (d), is a step of forming the gate electrode of the diode simultaneously with the gate electrode of the LDMOS transistor, and
   wherein the step (i) is a step of forming the field oxide film of the diode simultaneously with the field oxide film of the LDMOS transistor.

7. The method of manufacturing a semiconductor device according to claim 6,
   wherein the length of the field oxide film of the diode is shorter than that of the field oxide film of the LDMOS transistor.

8. The method of manufacturing a semiconductor device according to claim 6,
wherein the length from the PN junction to the field oxide film of the diode is 1.7 μm or more.

9. The method of manufacturing a semiconductor device according to claim 6,
wherein a multi-channel structure is formed by including two or more regions having electrodes each paired with a drift region to one of a region having the first electrode and a region having the second electrode.

10. The method of manufacturing a semiconductor device according to claim 6,
wherein the semiconductor substrate is an SOI substrate in which an insulation layer is formed inside a silicon layer.

\* \* \* \* \*